(12) United States Patent
Katayama et al.

(10) Patent No.: US 8,686,499 B2
(45) Date of Patent: Apr. 1, 2014

(54) SEMICONDUCTOR DEVICE

(75) Inventors: Masaya Katayama, Yokohama (JP);
Masayoshi Asano, Yokohama (JP)

(73) Assignee: Fujitsu Semiconductor Limited,
Yokohama (JP)

( * ) Notice: Subject to any disclaimer, the term of this patent is extended or adjusted under 35 U.S.C. 154(b) by 0 days.

(21) Appl. No.: 13/226,628

(22) Filed: Sep. 7, 2011

(65) Prior Publication Data

US 2012/0119292 A1    May 17, 2012

(30) Foreign Application Priority Data

Nov. 11, 2010 (JP) ................... 2010-252479

(51) Int. Cl.
*H01L 29/66* (2006.01)
*H01L 29/76* (2006.01)
*H01L 21/02* (2006.01)

(52) U.S. Cl.
USPC ........... 257/335; 288/336; 288/339; 288/343; 288/344; 288/346; 367/409

(58) Field of Classification Search
USPC .......... 257/335, 336, 409, E21.417, E29.256, 257/288, 339–343, 346, 367, 496, E29.04, 257/E29.12, E29.026–E29.027, E29.054, 257/E29.063, E29.066, E29.118, 257/E29.133–E29.136, E29.262–E29.264, 257/E29.268, E29.427, E29.598; 438/195, 438/197, 199, 201, 218, 239, 270, 275, 276, 438/286, 289, 301, 433, 527, 619, 763
See application file for complete search history.

(56) References Cited

U.S. PATENT DOCUMENTS

| | | | | |
|---|---|---|---|---|
| 6,137,140 A | * | 10/2000 | Efland et al. | 257/343 |
| 7,309,900 B2 | * | 12/2007 | Nakano et al. | 257/401 |
| 2003/0057502 A1 | * | 3/2003 | Yamamoto | 257/392 |
| 2004/0251492 A1 | * | 12/2004 | Lin | 257/335 |
| 2010/0213545 A1 | * | 8/2010 | Kho et al. | 257/339 |

FOREIGN PATENT DOCUMENTS

| | | | | |
|---|---|---|---|---|
| JP | 2002-094054 A | | 3/2002 | |
| JP | 2007-067181 A | | 3/2007 | |
| JP | 2007067181 | * | 3/2007 | ............. H01L 29/78 |
| JP | 2008-091689 A | | 4/2008 | |

* cited by examiner

*Primary Examiner* — Steven Loke
*Assistant Examiner* — Juanita B Rhodes
(74) *Attorney, Agent, or Firm* — Westerman, Hattori, Daniels & Adrian, LLP

(57) ABSTRACT

A semiconductor device includes a p-type semiconductor substrate, an n-type drift region formed in the p-type semiconductor substrate, and a p-type body region formed in the n-type drift region. A circular gate electrode is formed over a pn junction between sides of the p-type body region and the n-type drift region along the pn junction. An n-type drain region and an n-type source region are formed in the n-type drift region and the p-type body region, respectively, with a part of the gate electrode between.

10 Claims, 20 Drawing Sheets

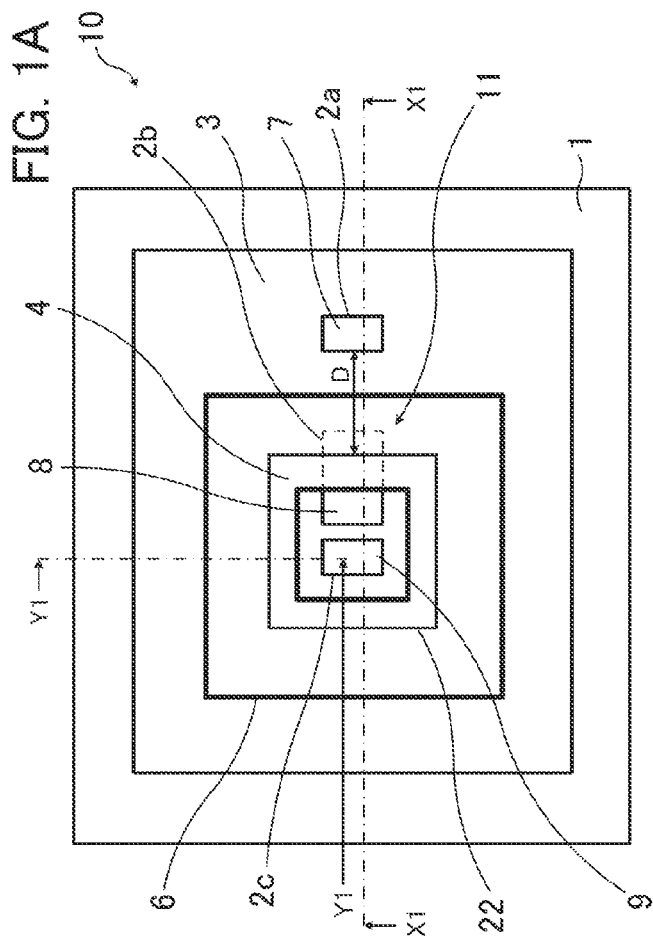
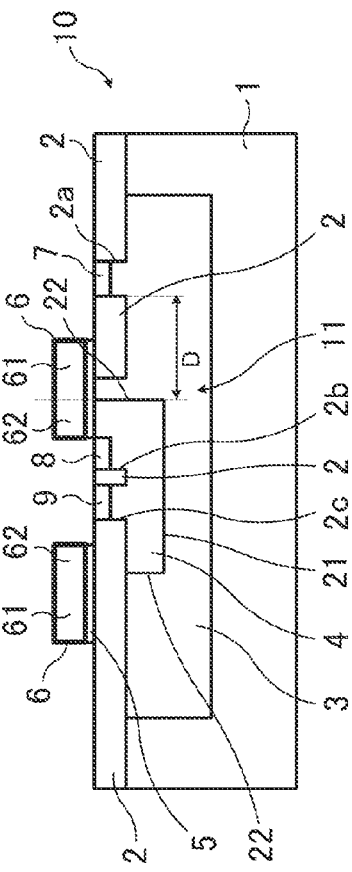
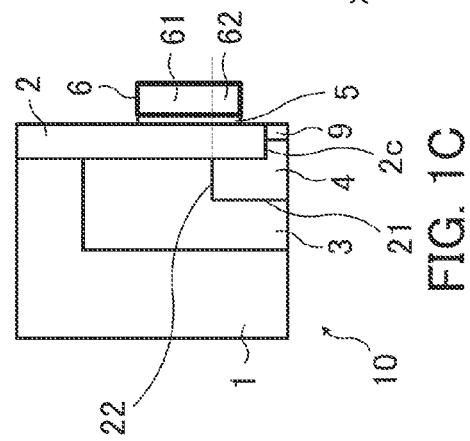

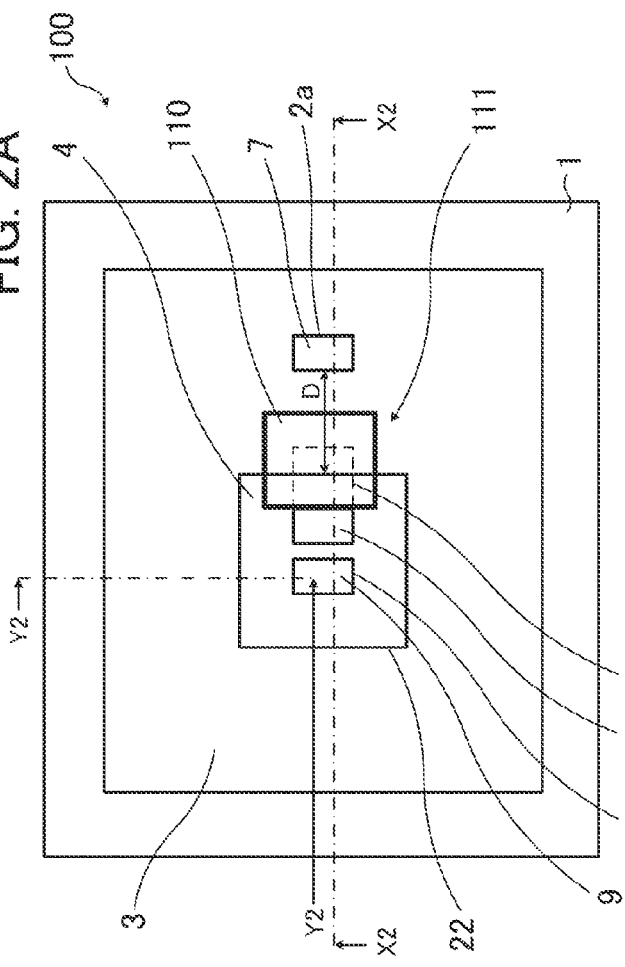
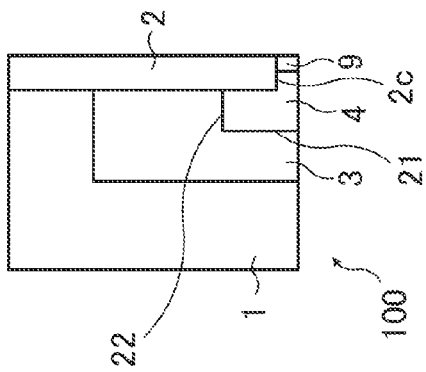
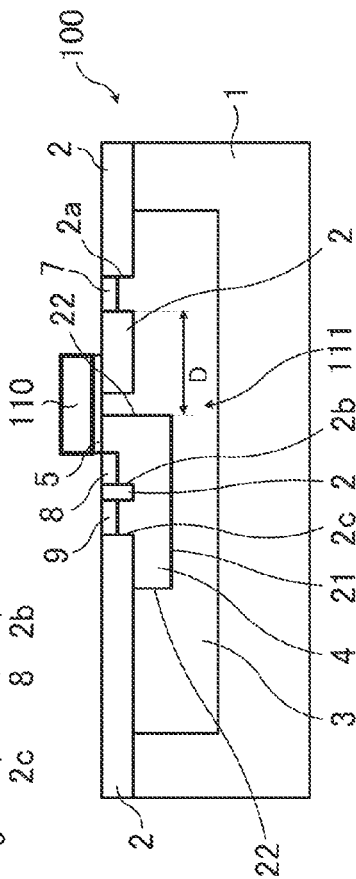

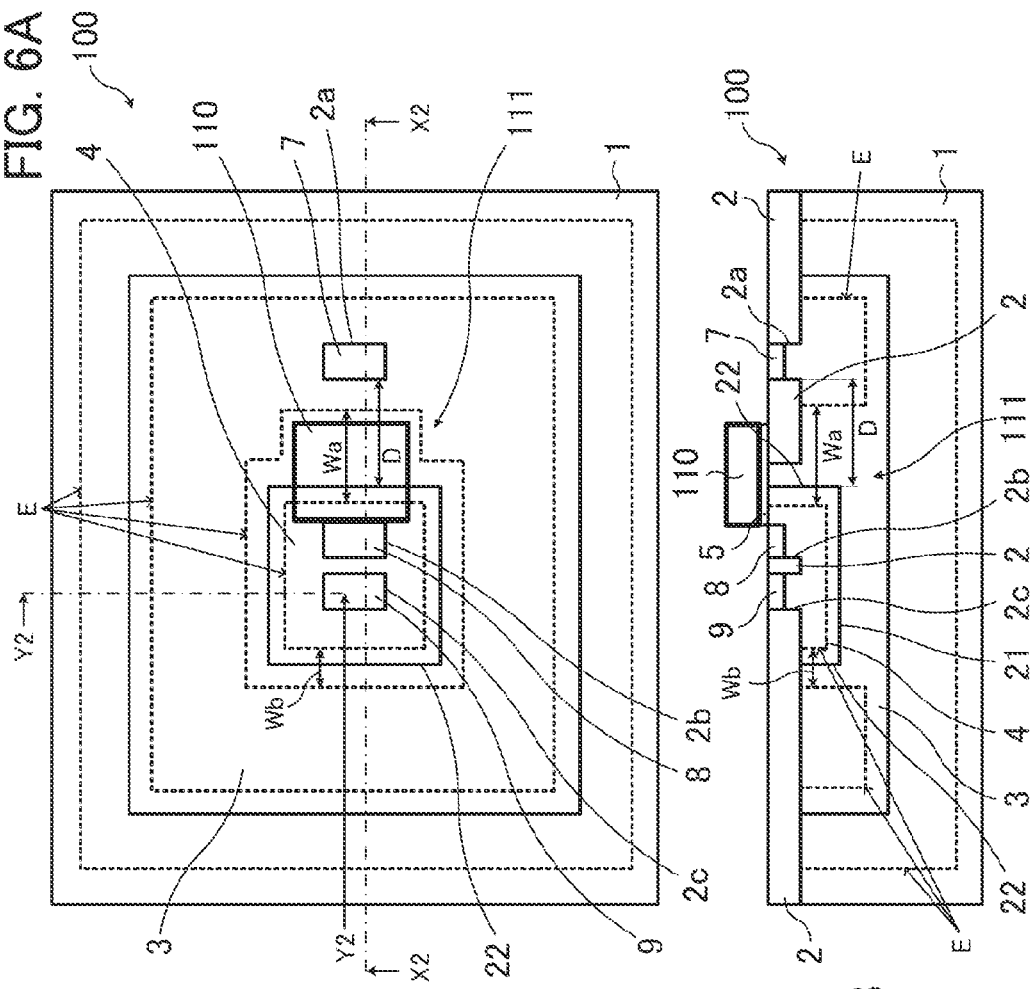
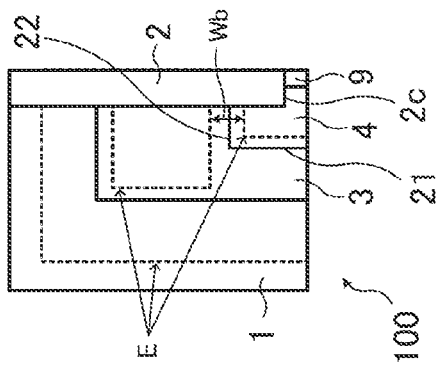

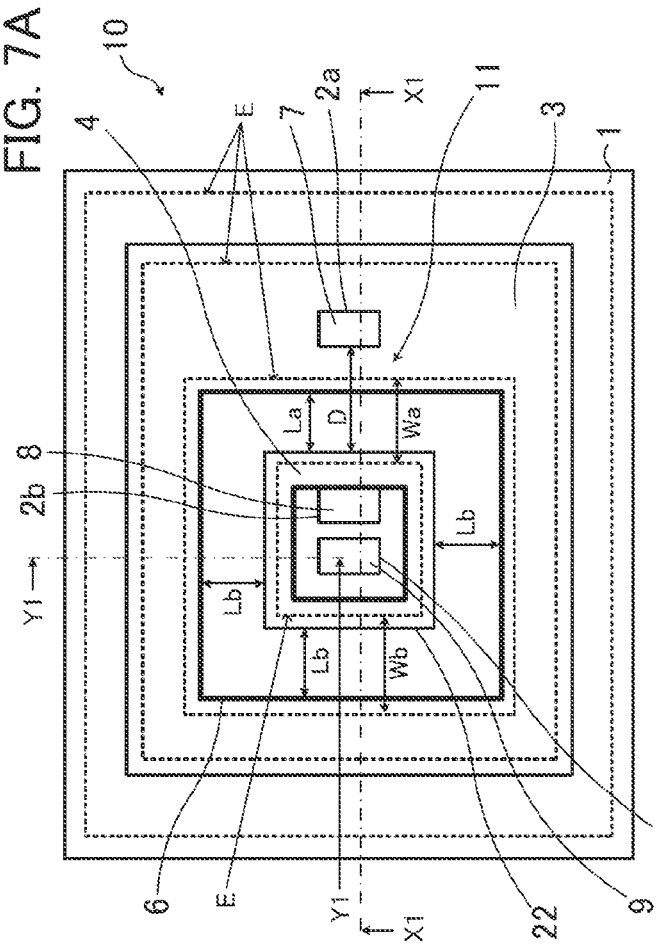
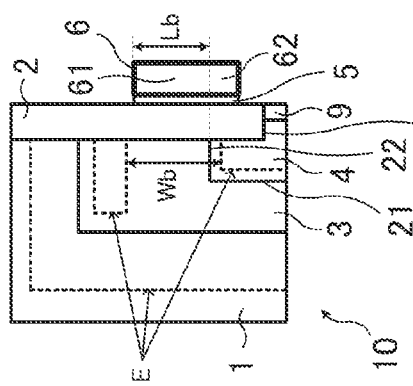
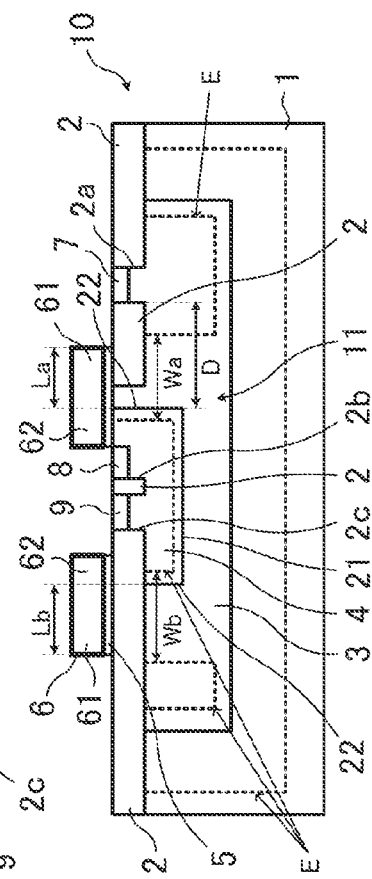
FIG. 7A
FIG. 7B
FIG. 7C

US 8,686,499 B2

SEMICONDUCTOR DEVICE

CROSS-REFERENCE TO RELATED APPLICATION

This application is based upon and claims the benefit of priority of the prior Japanese Patent Application No. 2010-252479, filed on Nov. 11, 2010, the entire contents of which are incorporated herein by reference.

FIELD

The embodiments discussed herein are related to a semiconductor device.

BACKGROUND

What is called a lateral double-diffused field-effect transistor has traditionally been known as one of transistors which operate at the time of a relatively high voltage being applied.

With a lateral double-diffused field-effect transistor, an n-well diffusion layer is formed, for example, in a p-type substrate, a p-body diffusion layer is formed in the n-well diffusion layer, and a drain diffusion layer and a source diffusion layer are formed in the n-well diffusion layer and the p-body diffusion layer respectively. In addition, a gate electrode is formed over the p-type substrate between the drain diffusion layer and the source diffusion layer and over the n-well diffusion layer and the p-body diffusion layer. With such a lateral double-diffused field-effect transistor a technique for adjusting the length of or impurity concentration in a region (drift region) between a p-body diffusion layer and a drain diffusion layer, a technique for forming a local oxide film over a drift region, and the like are also known. Furthermore, a structure in which a source diffusion layer is surrounded by a frame-like drain diffusion layer and in which a frame-like gate electrode is formed over a p-type substrate between the source diffusion layer and the frame-like drain diffusion layer and over an n-well diffusion layer and a p-body diffusion layer is also known as a lateral double-diffused field-effect transistor.
Japanese Laid-open Patent Publication No. 2008-091689
Japanese Laid-open Patent Publication No. 2007-067181

With a lateral double-diffused field-effect transistor, however, it may be impossible to ensure desired breakdown voltage, depending on the structure. For example, it may be impossible to ensure desired breakdown voltage, depending on the placement of a diffusion layer in a substrate and a gate electrode. This may cause a deterioration in the performance of a transistor having such a structure and an apparatus including a transistor having such a structure.

SUMMARY

According to an aspect of the invention, there is provided a semiconductor device including a semiconductor substrate of a first conduction type, a first region of a second conduction type formed in the semiconductor substrate, a second region of the first conduction type formed in the first region, a circular gate electrode formed over a junction of the second region and the first region along the junction, and a drain region and a source region of the second conduction type formed in the first region and the second region, respectively, with a part of the gate electrode between.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 1A through 1C illustrate an example of a semiconductor device;
FIGS. 2A through 2C illustrate an example of a semiconductor device for comparison;
FIGS. 6A through 6C are views for describing the extent of a depletion layer in the example of a semiconductor device for comparison at breakdown time;
FIGS. 7A through 7C are views for describing the extent of a depletion layer in the semiconductor device at breakdown time.

DESCRIPTION OF EMBODIMENT

Figure 3:
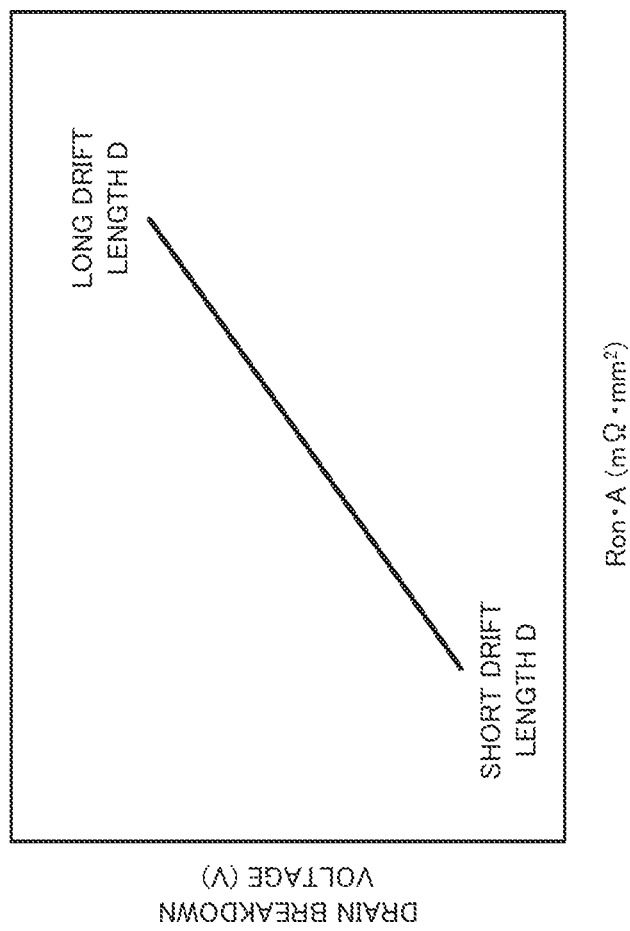
FIG. 3 indicates relationships among drift length, drain breakdown voltage, and Ron•A.

FIGS. 1A through 1C illustrate an example of a semiconductor device. FIG. 1A is a fragmentary schematic plan view, FIG. 1B is a schematic sectional view taken along lines X1-X1 of FIG. 1A, and FIG. 1C is a schematic sectional view taken along lines Y1-Y1 of FIG. 1A.

As illustrated in FIGS. 1A through 1C, a semiconductor device 10 includes a p-type semiconductor substrate 1, an isolation region 2, an n-type drift region 3, a p-type body region 4, a gate insulating film 5, a gate electrode 6, an n-type drain region 7, an n-type source region 8, and a p-type tap region 9.

For example, a p-type silicon (Si) substrate may be used as the p-type semiconductor substrate 1. The isolation region 2 is formed in the p-type semiconductor substrate 1 on the surface side by, for example, a STI (Shallow Trench Isolation) method. In FIG. 1A, the isolation region 2 is not illustrated for convenience's sake. For example, regions (opening portions) 2a, 2b, and 2c in which the p-type semiconductor substrate 1 is exposed are formed in the isolation region 2.

An isolation region (not illustrated) having opening portions 2a, 2b, and 2c which are the same as the opening portions 2a, 2b, and 2c formed in the isolation region 2 may be formed in the p-type semiconductor substrate 1 by a LOCOS (Local Oxidation of Silicon) method.

The n-type drift region 3 is formed to a determined depth from the surface of the p-type semiconductor substrate 1 so that it will cover the opening portions 2a, 2b, and 2c. The p-type body region 4 is formed to a depth from the surface of the p-type semiconductor substrate 1 which is shallower than the n-type drift region 3 so that its outer surface (sides and bottom) will be covered with the n-type drift region 3. The p-type body region 4 is formed in the n-type drift region 3 so that it will cover a part of the opening portion 2b and the opening portion 2c.

A pn junction 21 is formed between the n-type drift region 3 and the bottom of the p-type body region 4 and a pn junction 22 is formed between the n-type drift region 3 and the sides of the p-type body region 4. The gate electrode 6 is formed over the pn junction 22 between the n-type drift region 3 and the sides of the p-type body region 4 of the pn junctions 21 and 22 with the gate insulating film 5 between. The gate electrode 6 has determined width, is circular, and is formed along the pn junction 22. The gate electrode 6 includes an outer portion 61 which is over the n-type drift region 3 horizontally outside the pn junction 22 and an inner portion 62 which is over the p-type body region 4 horizontally inside the pn junction 22. Each of the outer portion 61 and the inner portion 62 has determined width. The gate electrode 6 is formed so that it will not cover the opening portion 2a or 2c and so that it will cover a part of the opening portion 2b. The gate insulating film 5 is formed under the gate electrode 6 and is equal to the gate electrode 6 in shape. In FIG. 1A, the pn junction 22 under the gate electrode 6 and the gate insulating film 5 is indicated by a solid line for convenience's sake.

The n-type drain region 7 is formed in the opening portion 2a (in the n-type drift region 3). The n-type drain region 7 is formed away from the edge of the gate electrode 6. As a result, the opening portion 2a in which the n-type drain region 7 is formed is formed away from the gate electrode 6. The n-type source region 8 is formed in a part of the opening portion 2b (in the p-type body region 4) which is not covered with the gate electrode 6 or the gate insulating film 5. In addition, the p-type tap region 9 is formed in the opening portion 2c (in the p-type body region 4).

A transistor section 11 of the semiconductor device 10 includes the n-type drain region 7, the n-type source region 8, a region between the n-type drain region 7 and the n-type source region 8, and the gate insulating film 5 and the gate electrode 6 over the region. The transistor section 11 in this example functions as what is called an n-channel lateral double-diffused MOS (Metal Oxide Semiconductor) transistor.

In the semiconductor device 10 the p-type tap region 9 and the n-type source region 8, for example, are connected to negative-side power supply voltage Vss. A relatively low positive voltage Vgs, for example, is applied between the gate electrode 6 and the n-type source region 8 and a relatively high voltage Vds is applied to the n-type drain region 7. By applying the voltage Vgs which is higher than or equal to a determined value Vth to the gate electrode 6, electrons flow from the n-type source region 8 to the n-type drain region 7. By making an impurity concentration in the n-type drift region 3 in which electrons flow relatively low, a depletion layer expands in the n-type drift region 3 and a high voltage may be applied to the n-type drain region 7.

The upper limit (drain breakdown voltage) of voltage applied to the n-type drain region 7 is influenced by, for example, breakdown voltage of a junction between the n-type drift region 3 and the p-type body region 4. The breakdown voltage of the junction between the n-type drift region 3 and the p-type body region 4 is influenced by the width of the depletion layer. The width of the depletion layer is influenced by the impurity concentration in the n-type drift region 3 and the distance (drift length) D from the p-type body region 4 (pn junction 22) to the n-type drain region 7. That is to say, a high voltage may be applied to the n-type drain region 7 by lowering the impurity concentration in the n-type drift region 3 and increasing the drift length D. However, a reduction in the impurity concentration in the n-type drift region 3 and an increase in the drift length D cause an increase in the on-state resistance Ron of the transistor section 11. Accordingly, for example, the drift length D and the impurity concentration in the n-type drift region 3 are set with this taken into consideration.

In the semiconductor device 10 a high voltage may be applied to all of the gate electrode 6, the p-type tap region 9, the n-type source region 8, and the n-type drain region 7. In this case, the n-type drift region 3 prevents punch-through between the p-type body region 4 and the p-type semiconductor substrate 1. However, as the impurity concentration in the n-type drift region 3 decreases, punch-through is more apt to occur (punch-through breakdown voltage falls). Accordingly, in addition to the drain breakdown voltage and the on-state resistance Ron, for example, this is taken into consideration for setting the impurity concentration in the n-type drift region 3.

In this example, the n-type drain region 7 and the n-type source region 8 are formed in the different opening portions 2a and 2b, respectively, and the isolation region 2 is formed between the n-type drain region 7 and the n-type source region 8. By doing so, the effect of, for example, preventing a breakdown of the gate insulating film 5 at the edge of the gate electrode 6 is obtained. It is not necessary to form the isolation region 2 between the n-type drain region 7 and the n-type source region 8, depending on conditions under which the semiconductor device 10 operates, drift length D, the impurity concentration in the n-type drift region 3, and the like. In that case, an opening portion in which the n-type drain region 7, the n-type source region 8, the n-type drift region 3 between the n-type drain region 7 and the n-type source region 8, and the p-type body region 4 are exposed is formed in the isolation region 2. In this opening portion, the gate electrode 6 is formed along the pn junction 22 between the n-type drift region 3 and the p-type body region 4, the n-type drain region 7 is formed away from the gate electrode 6 in the n-type drift region 3, and the n-type source region 8 is formed in the p-type body region 4.

Furthermore, in this example the n-type source region 8 and the p-type tap region 9 are formed in the different opening portions 2b and 2c respectively. However, it is not necessary to form the isolation region 2 between the n-type source region 8 and the p-type tap region 9. The n-type source region 8 and the p-type tap region 9 may be formed in the same opening portion.

In the semiconductor device 10, as has been described, the circular gate electrode 6 is formed so that it will cover the pn junction 22 between the n-type drift region 3 and (the sides of) the p-type body region 4. In order to increase breakdown voltage of the semiconductor device 10, the circular gate electrode 6 is formed in such a position. This will now be described in further detail.

First a semiconductor device without a circular gate electrode like that described above will be described for comparison.

FIGS. 2A through 2C illustrate an example of a semiconductor device for comparison. FIG. 2A is a fragmentary schematic plan view, FIG. 2B is a schematic sectional view taken along lines X2-X2 of FIG. 2A, and FIG. 2C is a schematic sectional view taken along lines Y2-Y2 of FIG. 2A. In FIG. 2A, an isolation region 2 is not illustrated and a pn junction 22 under a gate electrode 110 is indicated by a solid line, for convenience' sake.

As illustrated in FIGS. 2A to 2C, a semiconductor device 100 differs from the above semiconductor device 10 illustrated in FIGS. 1A through 1C in that the gate electrode 110 included therein is not circular but islandlike. The gate electrode 110 is formed so that it will cover an n-type drift region 3 and a p-type body region 4 in an opening portion 2b between an n-type drain region 7 and an n-type source region 8. A transistor section 111 of the semiconductor device 100 includes the n-type drain region 7, the n-type source region 8, a region between the n-type drain region 7 and the n-type source region 8, and a gate insulating film 5 and the gate electrode 110 over the region.

By the way, the characteristics of a high breakdown voltage transistor depend not only on the above drain breakdown voltage but also on a value (Ron•A) obtained by multiplying the on-state resistance Ron of the transistor and occupied area A together. The on-state resistance Ron is a value obtained by applying a low voltage of about 0.1 volt to a drain and dividing this drain voltage by an electric current which flows through the drain at the time of putting a gate into an on state. If a Ron•A value is low, then the characteristics of the transistor are good. A Ron•value varies according to, for example, drift length D. With an increase in the drift length D, the on-state resistance Ron becomes higher and the occupied area A becomes larger. That is to say, a relationship indicated in FIG. 3 may exist among the drift length D, the drain breakdown voltage, and a Ron•A value. As is seen from the relationship indicated in FIG. 3, a long drift length D and a high drain breakdown voltage lead to a high Ron•A value and a short drift length D and a low Ron•value lead to a low drain breakdown voltage. When a high breakdown voltage transistor is designed, desired characteristics are determined with, for example, such a relationship taken into consideration.

With the semiconductor device 100 illustrated in FIGS. 2A through 2C, drain breakdown voltage is expected to become higher with an increase in drift length D according to the relationship indicated in FIG. 3. With the actual structure of the semiconductor device 100 illustrated in FIGS. 2A through 2C, however, drain breakdown voltage may not become higher with an increase in the drift length D if the drift length D is longer than or equal to a determined length.

Figure 4:
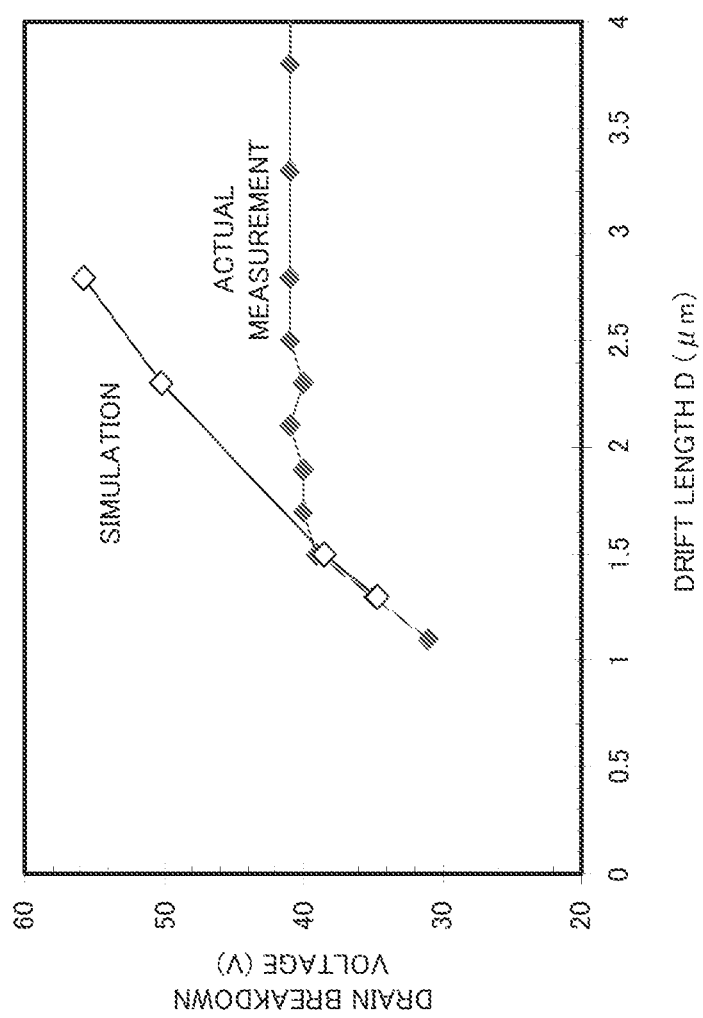
FIG. 4 indicates results obtained by simulating and actually measuring the dependence of drain breakdown voltage on drift length.

FIG. 4 indicates results obtained by simulating and actually measuring the dependence of drain breakdown voltage on drift length. A simulation is done by the use of what is called TCAD (Technology Computer Aided Design) and a two-dimensional sectional structure illustrated in FIG. 5. Actual measurement is made by actually fabricating the semiconductor device 100 illustrated in FIGS. 2A to 2C.

Figure 5:
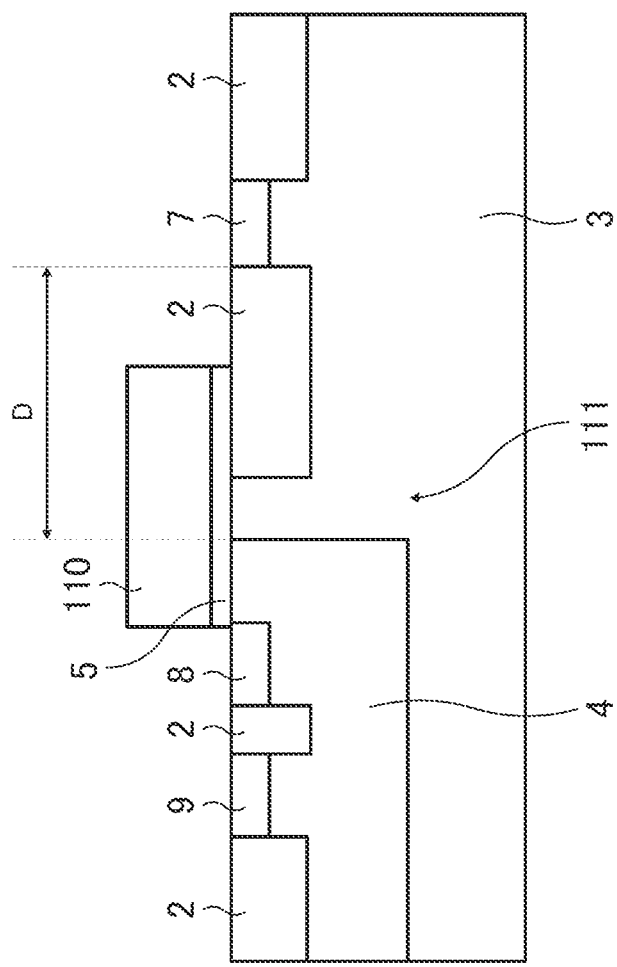
FIG. 5 illustrates a two-dimensional sectional structure used for a simulation (part 1)

According to the results of the simulation done by the use of the two-dimensional sectional structure illustrated in FIG. 5, as indicated in FIG. 4, drain breakdown voltage becomes higher with an increase in the drift length D. According to the results of actual measurement using the actually fabricated semiconductor device 100, on the other hand, drain breakdown voltage becomes higher with an increase in the drift length D if the drift length D is shorter than or equal to about 1.5 μm. However, if the drift length D is longer than about 1.5 μm, drain breakdown voltage becomes approximately constant at a voltage of about 40 volts. That is to say, with the actually fabricated semiconductor device 100 drain breakdown voltage higher than about 40 V may not be obtained even if the drift length D is made longer than or equal to a determined value. The reason for this may be as follows.

FIGS. 6A through 6C are views for describing the extent of a depletion layer in the example of a semiconductor device for comparison at breakdown time. FIGS. 6A through 6C correspond to the above FIGS. 2A through 2C respectively. In FIGS. 6A through 6C, the edge E of each depletion layer is schematically indicated by a dotted line.

The drift length D in the semiconductor device 100 is 3.0 μm. In the semiconductor device 100 a voltage of 0 volt is applied to the gate electrode 110, the n-type source region 8, a p-type tap region 9, and a p-type semiconductor substrate 1 and voltage corresponding to drain breakdown voltage is applied to the n-type drain region 7. As is seen from the simulation results indicated in FIG. 4, drain breakdown voltage is higher than or equal to 55 V if the drift length D is 3.0 μm. According to the actual measurement results, however, only about 40 V is obtained.

As illustrated in FIGS. 6A through 6C, a depletion layer with a width (depletion layer width) of Wa extends along the gate electrode 110 in the section (transistor section 111) in which the gate electrode 110 is placed, because a voltage of 0 volt is applied to the gate electrode 110. As illustrated in FIGS. 6A through 6C, on the other hand, a depletion layer with a width (depletion layer width) of Wb which depends on impurity concentration in the n-type drift region 3 and the p-type body region 4 extends in a section in which the gate electrode 110 is not placed. In the example of FIGS. 6A through 6C, the depletion layer width Wa is wider than the depletion layer width Wb.

A breakdown is apt to occur in a portion in which a depletion layer is narrow, because an electric field is stronger in a portion in which a depletion layer is narrow than in a portion in which a depletion layer is wide. Therefore, in the semiconductor device 100 a breakdown is apt to occur in the section in which depletion layer width is Wb narrower than Wa. In the section in which depletion layer width is Wb, unlike the section (transistor section 111) in which depletion layer width is Wa, breakdown voltage depends not on the drift length D but on impurity concentration in the n-type drift region 3 and the p-type body region 4. Breakdown voltage in the section in which depletion layer width is Wb is about 40 V. Accordingly, as is seen from the actual measurement results indicated in FIG. 4, breakdown voltage of the semiconductor device 100 becomes constant at a voltage of about 40 volts. Even if the drift length D is made longer than or equal to the determined value, breakdown voltage of the semiconductor device 100 is considered not to become higher than about 40 V.

The extent of a depletion layer on the n-type drift region 3 side in the section (transistor section 111) in which depletion layer width is Wa is restrained by the n-type drain region 7. Therefore, there is a case where the drift length D is short and where the depletion layer width Wa is narrower than the depletion layer width Wb. In this case, drain breakdown voltage depends on the drift length D. The actual measurement results which are indicated in FIG. 4 and which correspond to the drift length D shorter than 1.5 μm show this tendency. That is to say, drain breakdown voltage rises with an increase in the drift length D.

According to the simulation results indicated in FIG. 4, drain breakdown voltage depends on the drift length D. The reason for this is that this simulation is done by the use of the two-dimensional sectional structure illustrated in FIG. 5. In other words, the depletion layer with a width of Wb outside the transistor section 111 illustrated in FIGS. 6A through 6C, that is to say, a pn junction 22 between the n-type drift region 3 and the p-type body region 4 in a region where the gate electrode 110 is not placed is not included in the two-dimensional sectional structure used for doing the simulation.

Unlike the semiconductor device 100 having the above structure, the above semiconductor device 10 illustrated in FIGS. 1A through 1C includes the circular gate electrode 6 formed along the pn junction 22 between the n-type drift region 3 and the p-type body region 4, thereby making it possible to increase drain breakdown voltage.

FIGS. 7A through 7C are views for describing the extent of a depletion layer in the semiconductor device at breakdown time. In the semiconductor device 10 a voltage of 0 volt is applied to the gate electrode 6, the n-type source region 8, the p-type tap region 9, and the p-type semiconductor substrate 1 and voltage corresponding to drain breakdown voltage is applied to the n-type drain region 7. FIGS. 7A through 7C correspond to the above FIGS. 1A through 1C respectively. In FIGS. 7A through 7C, the edge E of each depletion layer is schematically indicated by a dotted line.

The circular gate electrode 6 is formed along the pn junction 22. As a result, the width Wb of a depletion layer which extends in a region in which the n-type drain region 7 is not opposite to the n-type source region 8 is wide compared with the width Wb of the depletion layer which extends in the above semiconductor device 100 including the islandlike gate electrode 110. That is to say, with the semiconductor device 10 a depletion layer with a width of Wb which is equal to the width Wa of a depletion layer that extends in the transistor section 11 extends in a region outside the transistor section 11. The reason for this is as follows. The circular gate electrode 6 to which a voltage of 0 volt is applied is also placed in a region outside the transistor section 11. The depletion layer is extended by an electric field generated by the circular gate electrode 6. As a result, the width of the depletion layer becomes wider than or equal to depletion layer width determined by impurity concentration in the n-type drift region 3 and the p-type body region 4.

As has been described, with the semiconductor device 10 the circular gate electrode 6 is formed. This extends the depletion layer around the pn junction 22 and prevents the width of the depletion layer from partially narrowing. As a result, a breakdown may be prevented around the pn junction 22. Accordingly, drain breakdown voltage may be made high compared with the semiconductor device 100 having the above structure.

The width of the gate electrode 6 included in the semiconductor device 10 will now be described.

As illustrated in FIGS. 7A through 7C, it is assumed that the width of the outer portion 61 of the gate electrode 6 (of the gate electrode 6 in the transistor section 11) between the n-type drain region 7 and the n-type source region 8 is La and that the width of the outer portion 61 of the gate electrode 6 (of the outer portion 61 of a straight portion of the gate electrode 6) outside the transistor section 11 is Lb.

In the example of FIGS. 7A through 7C, the gate electrode 6 is formed so that La=Lb. In this case, it is possible to make the width Wa of the depletion layer that extends in the transistor section 11 in which the n-type drain region 7 is opposite to the n-type source region 8 equal to the width Wb of the depletion layer which extends in the region outside the transistor section 11. This prevents the width of the depletion layer from partially narrowing around the pn junction 22, and therefore prevents a breakdown.

Figure 8A:
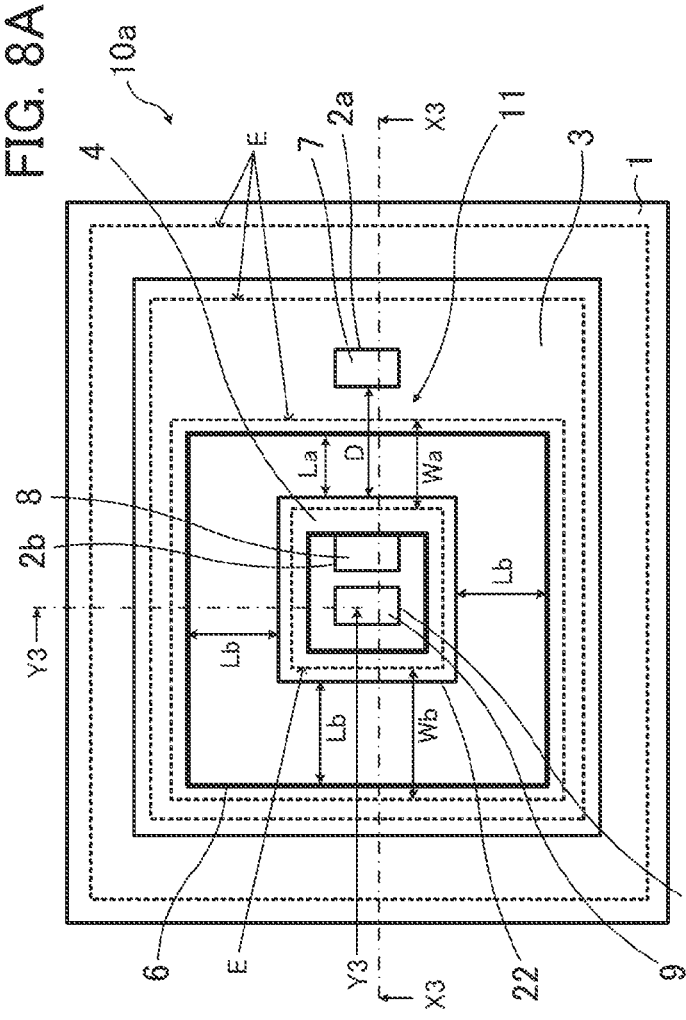
FIGS. 8A through 8C illustrate another example of a semiconductor device.
Figure 8C:
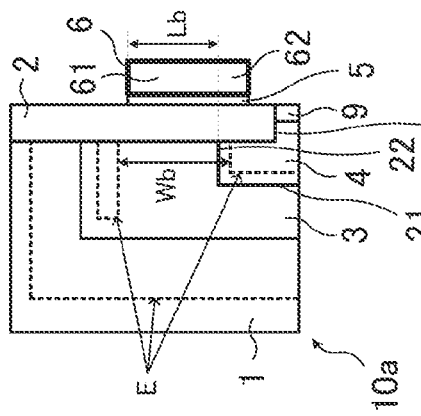
Figure 8B:
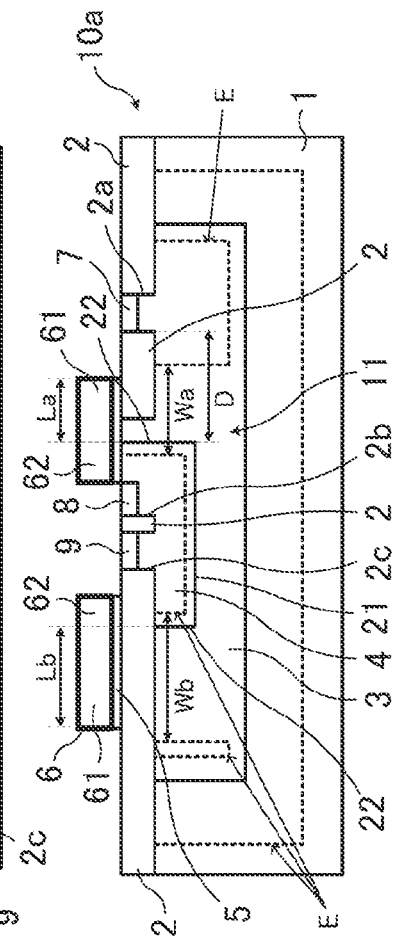

Furthermore, as illustrated in FIGS. 8A through 8C, the gate electrode 6 may be formed so that La<Lb.

FIGS. 8A through 8C illustrate another example of a semiconductor device. FIG. 8A is a fragmentary schematic plan view, FIG. 8B is a schematic sectional view taken along lines X3-X3 of FIG. 8A, and FIG. 8C is a schematic sectional view taken along lines Y3-Y3 of FIG. 8A. FIGS. 8A to 8C also illustrate the extent of a depletion layer at breakdown time. In a semiconductor device 10a a voltage of 0 volt is applied to a gate electrode 6, an n-type source region 8, a p-type tap region 9, and a p-type semiconductor substrate 1 and voltage corresponding to drain breakdown voltage is applied to an n-type drain region 7. In FIGS. 8A through 8C, the edge E of each depletion layer is schematically indicated by a dotted line. In FIG. 8A, an isolation region 2 is not illustrated and a pn junction 22 under a gate electrode 6 and a gate insulating film 5 is indicated by a solid line, for convenience's sake.

As with a semiconductor device 10a illustrated in FIGS. 8A through 8C, the circular gate electrode 6 may be formed so that (width La of outer portion 61)<(width Lb of outer portion 61). In this case, the width Wa of a depletion layer in a region between the n-type drain region 7 and the n-type source region 8, that is to say, in a transistor section 11 is narrower than the width Wb of a depletion layer in a region outside the transistor section 11. Accordingly, a breakdown is apt to occur at a lower voltage around the pn junction 22 in the transistor section 11 than in the region outside the transistor section 11. That is to say, if the gate electrode 6 is formed so that (width La of outer portion 61)<(width Lb of outer portion 61), then drain breakdown voltage of the semiconductor device 10a varies according to drift length D. Accordingly, the drain breakdown voltage may be estimated at circuit design time by the use of the drift length D.

The case where (width La of outer portion 61 of gate electrode 6)=(width Lb of outer portion 61 of gate electrode 6) and the case where (width La of outer portion 61 of gate electrode 6)<(width Lb of outer portion 61 of gate electrode 6) have been described. However, the gate electrode 6 may be formed so that (width La of outer portion 61)>(width Lb of outer portion 61). Even if the gate electrode 6 is formed so that (width La of outer portion 61)>(width Lb of outer portion 61), the width Wb of the depletion layer in a region outside the transistor section 11 may be made wide compared with the case where the gate electrode 6 is not formed. Therefore, it is possible to prevent a breakdown.

A simulation done by forming the circular gate electrode 6 over the pn junction 22 in the above way will now be described. Descriptions will be given with the semiconductor device 10a in which (width La of outer portion 61 of gate electrode 6)<(width Lb of outer portion 61 of gate electrode 6) as an example.

Figure 9:
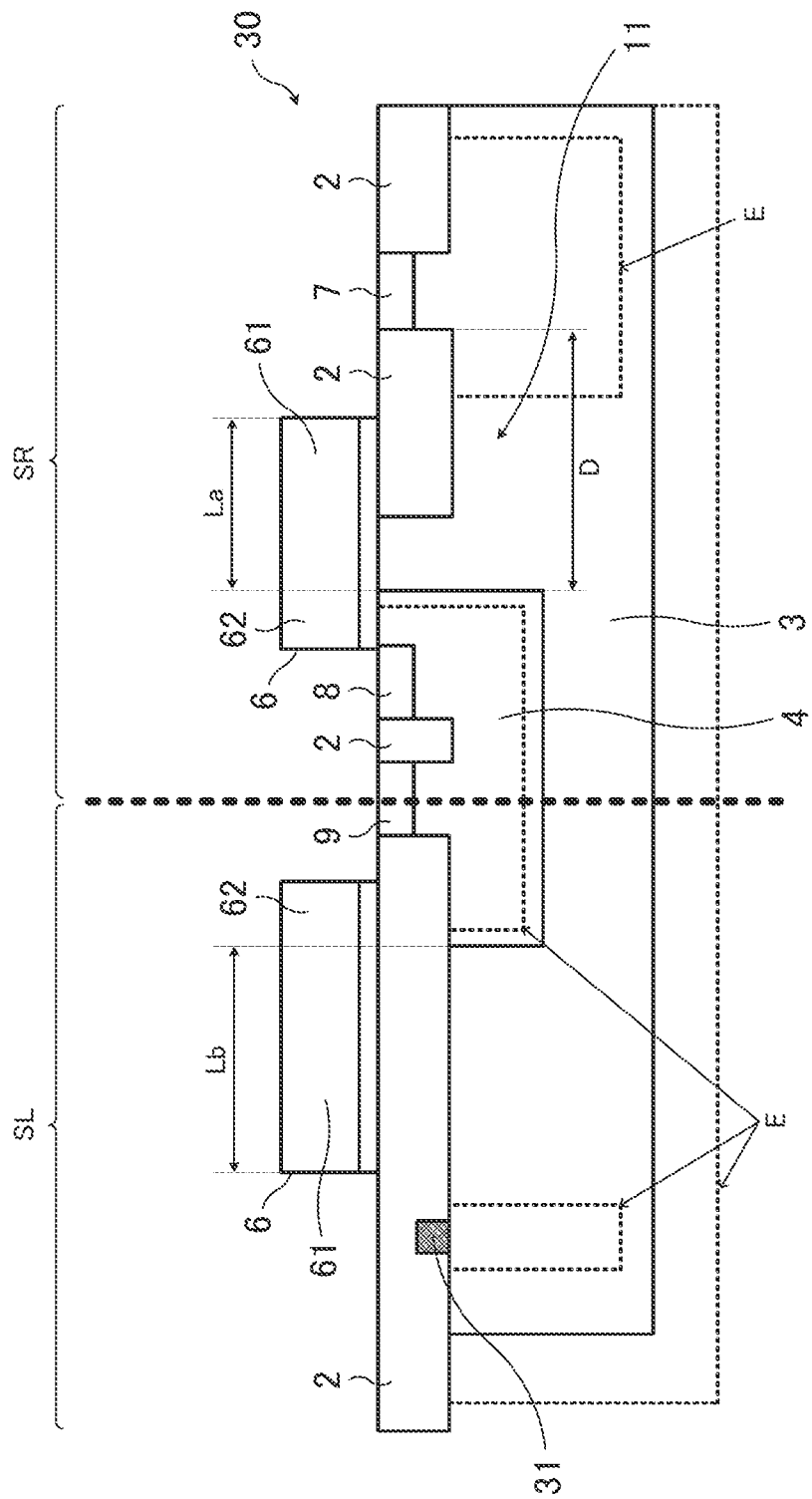
FIG. 9 illustrates a two-dimensional sectional structure used for simulations (part 2)

FIG. 9 illustrates a two-dimensional sectional structure used for simulations. FIG. 9 also illustrates the extent of a depletion layer at breakdown time. In the semiconductor device 10a a voltage of 0 volt is applied to the gate electrode 6, the n-type source region 8, the p-type tap region 9, and the p-type semiconductor substrate 1 and voltage corresponding to the drain breakdown voltage is applied to the n-type drain region 7. In FIG. 9, the edge E of each depletion layer is schematically indicated by a dotted line.

A two-dimensional sectional structure 30 illustrated in FIG. 9 corresponds to the sectional structure (FIG. 8B) of the semiconductor device 10a including the above circular gate electrode 6. With the two-dimensional sectional structure 30 illustrated in FIG. 9, however, a dummy electrode 31 is formed for simulations. The reason for this is as follows.

As illustrated in FIGS. 8A through 8C, when a high voltage is applied to the n-type drain region 7 of the semiconductor device 10a, the depletion layer extends widely in an n-type drift region 3. However, if the sectional structure illustrated in FIG. 8B is used in its original condition for a two-dimensional simulation, then the voltage applied to the n-type drain region 7 is not applied to the n-type drift region 3 in a left-hand structure SL illustrated in FIG. 9. Accordingly, as illustrated in FIG. 9, the two-dimensional sectional structure 30 is divided into a right-hand structure SR and the left-hand structure SL and a two-dimensional simulation of each structure is done. The right-hand structure SR includes the transistor section 11 and the left-hand structure SL does not include the transistor section 11. In order to apply voltage to the n-type drift region 3 in the left-hand structure SL, the dummy electrode 31 is formed. The formation of the dummy electrode 31 does not hamper the spreading of a depletion layer formed by the function of the gate electrode 6.

Figure 12:
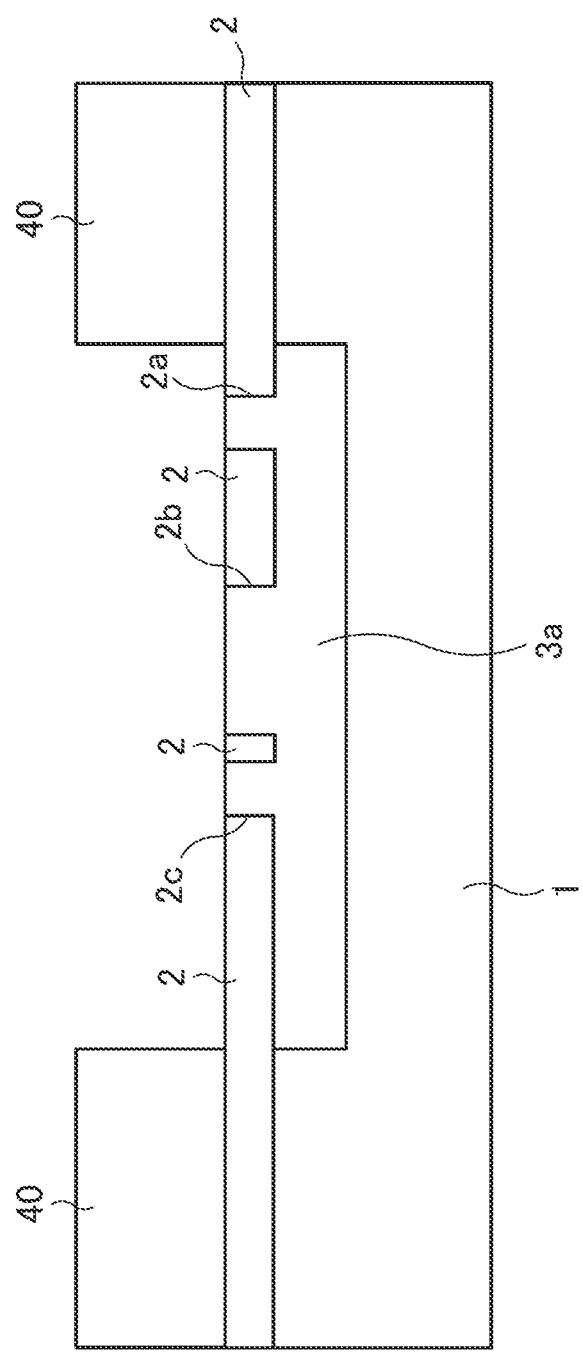
FIG. 12 illustrates an example of a first ion implantation process.

Conditions under which samples used for the simulations are fabricated will be described. As described later, the n-type drift region 3 is formed by implanting n-type impurity ions, such as phosphorus ions, in the p-type semiconductor substrate 1 (FIG. 12). With the samples used for the simulations, phosphorus ions are implanted twice. Phosphorus ions are implanted the first time with a dose of $2 \times 10^{12}$ ions/cm$^2$ at an energy of 2 MeV. Phosphorus ions are implanted the second time at an energy of 500 keV with four different doses, that is to say, with doses of $1.4 \times 10^{12}$ ions/cm$^2$, $1.7 \times 10^{12}$ ions/cm$^2$, $2.0 \times 10^{12}$ ions/cm$^2$, and $2.3 \times 10^{12}$ ions/cm$^2$. Drift length D is set to 3.8 μm. Width La of an outer portion 61 of the gate electrode 6 is set to 2.3 μm and width Lb (of the outer portion 61 of a straight portion of the gate electrode 6 outside the transistor section 11) is set to 3.0 μm. These conditions are set for realizing a high drain breakdown voltage of 80 volts or more.

In addition to simulations of the right-hand structure SR and the left-hand structure SL of FIG. 9, simulations of the structure illustrated in FIGS. 6A through 6C, that is to say, of a structure corresponding to the left-hand structure SL of FIG. 9 in which a gate electrode is not formed and in which the position of a dummy electrode 31 is adjusted are done.

Figure 10:
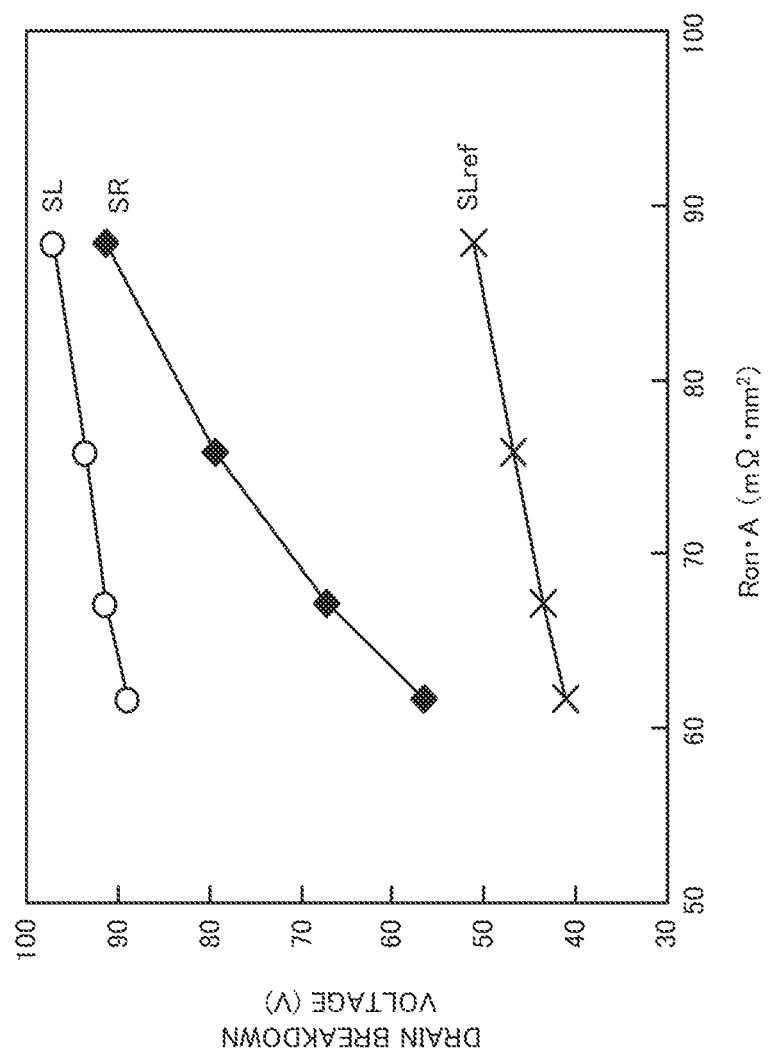
FIG. 10 indicates simulation results.

FIG. 10 indicates simulation results. FIG. 10 indicates the relationship between Ron•A (mΩ·mm$^2$) and drain breakdown voltage (V) obtained by doing simulations of the right-hand structure SR and the left-hand structure SL of FIG. 9 and the left-hand structure SL (left-hand structure SLref) of FIG. 9 in which a gate electrode is not formed. With each of the right-hand structure SR, the left-hand structure SL, and the left-hand structure SLref a point on a graph which corresponds to a smaller Ron•A value indicates that the n-type drift region 3 is formed at an energy of 500 keV with a higher dose.

With the right-hand structure SR, as indicated in FIG. 10, a Ron•A value becomes larger as a dose drops. However, drain breakdown voltage rises and a drain breakdown voltage of 91 volts is obtained.

With the left-hand structure SLref in which a gate electrode is not formed, as indicated in FIG. 10, drain breakdown voltage obtained is lower than drain breakdown voltage in the right-hand structure SR regardless of a dose or a Ron•A value. With a structure obtained by combining the left-hand structure SLref and the right-hand structure SR, that is to say, with the semiconductor device 100 illustrated in, for example, FIGS. 6A to 6C, drain breakdown voltage depends on the left-hand structure SLref and a drain breakdown voltage of only about 40 to 50 volts is obtained.

On the other hand, with the left-hand structure SL in which the circular gate electrode 6 is formed, as indicated in FIG. 10, drain breakdown voltage obtained is higher than drain breakdown voltage in the right-hand structure SR regardless of a dose or a Ron•A value. With a structure obtained by combining the left-hand structure SL and the right-hand structure SR, that is to say, with the semiconductor device 10a illustrated in FIGS. 8A through 8C, drain breakdown voltage depends not on the left-hand structure SL but on the right-hand structure SR including the transistor section 11. With the semiconductor device 10a a desired high drain breakdown voltage may be obtained by adjusting the drift length D and impurity concentration in the n-type drift region 3.

Simulations of the semiconductor device 10a in which (width La of outer portion 61 of gate electrode 6)<(width Lb of outer portion 61 of gate electrode 6) have been described.

With the semiconductor device 10 in which (width La of outer portion 61 of gate electrode 6)=(width Lb of outer portion 61 of gate electrode 6), drain breakdown voltage in a structure corresponding to the above left-hand structure SL is approximately the same as drain breakdown voltage in the right-hand structure SR indicated in FIG. 10 with respect to a Ron•A value. Accordingly, with the semiconductor device 10 a desired high drain breakdown voltage may also be obtained by adjusting drift length D and impurity concentration in the n-type drift region 3.

In addition, with a semiconductor device in which (width La of outer portion 61 of gate electrode 6)>(width Lb of outer portion 61 of gate electrode 6), drain breakdown voltage in a structure corresponding to the above left-hand structure SL is lower than drain breakdown voltage in the right-hand structure SR indicated in FIG. 10 with respect to a Ron•A value. However, the gate electrode 6 is formed, so drain breakdown voltage obtained is higher than the drain breakdown voltage in the left-hand structure SLref indicated in FIG. 10. Therefore, with this semiconductor device drain breakdown voltage is also increased compared with the case where the circular gate electrode 6 is not formed.

A method for fabricating a semiconductor device including the above circular gate electrode will now be described.

An example of a method for fabricating the semiconductor device 10a (FIGS. 8A through 8C) in which (width La of outer portion 61 of gate electrode 6)<(width Lb of outer portion 61 of gate electrode 6) will be described with reference to FIGS. 11 through 19. Each of FIGS. 11 through 19 is a fragmentary schematic sectional view of a fabrication process of the semiconductor device 10a. FIGS. 11 through 19 correspond to FIG. 8B. Each fabrication process will now be described in order.

Figure 11:
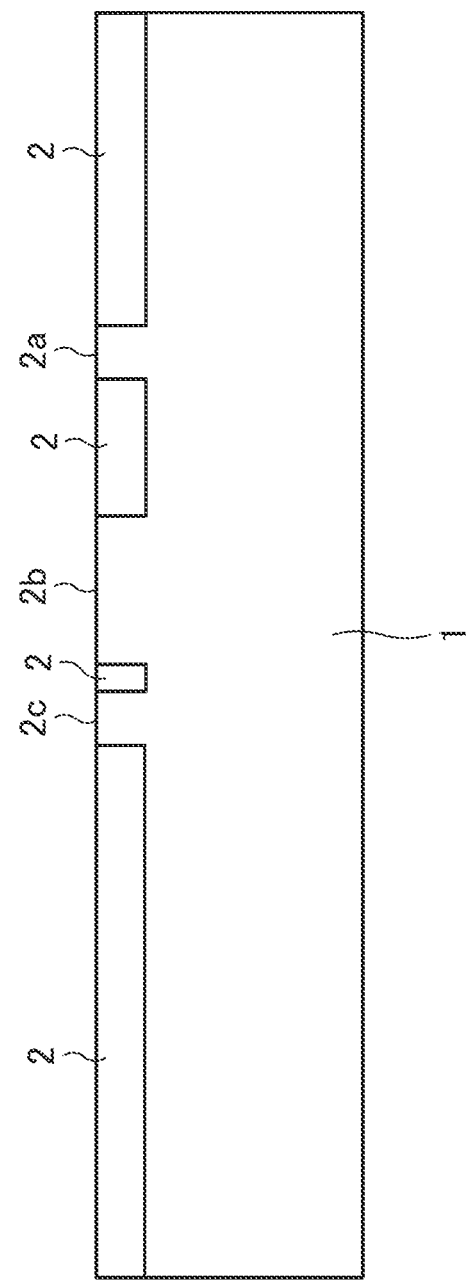
FIG. 11 illustrates an example of an isolation region formation process.

FIG. 11 illustrates an example of an isolation region formation process.

First the isolation region 2 is formed in the p-type semiconductor substrate 1, such as a p-type Si substrate, by the STI method. The depth of the isolation region 2 is set to, for example, 200 to 400 nm from the surface of the p-type semiconductor substrate 1.

The isolation region 2 is formed so that determined regions of the p-type semiconductor substrate 1 will be exposed. For example, the isolation region 2 is formed so that a region (opening portion) 2a where the n-type drain region 7 is to be formed, a region (opening portion) 2b where the n-type source region 8 and a part of the gate electrode 6 are to be formed, and a region (opening portion) 2c where the p-type tap region 9 is to be formed will be exposed.

FIG. 12 illustrates an example of a first ion implantation process.

After the formation of the isolation region 2, as illustrated in FIG. 12, a resist pattern 40 is formed by photolithography so that a region including the opening portions 2a, 2b, and 2c will be exposed. n-type impurity ions, such as phosphorus ions, are then implanted with the resist pattern 40 as a mask. In this case, phosphorus ions are implanted with a dose of $1\times10^{12}$ to $3\times10^{13}$ ions/cm$^2$ at an energy of 300 keV to 2 MeV. This ion implantation process may be realized by performing ion implantation plural times at divided energies. For example, phosphorus ions are implanted with a dose of $1\times10^{12}$ to $5\times10^{12}$ ions/cm$^2$ at an energy of 2 MeV. Phosphorus ions are then implanted with a dose of $1\times10^{13}$ to $3\times10^{13}$ ions/cm$^2$ at an energy of 500 keV. That is to say, ion implantation is performed twice.

As illustrated in FIG. 12, an n-type impurity implantation region 3a is formed in this way in the p-type semiconductor substrate 1. The resist pattern 40 is then removed.

Figure 13:
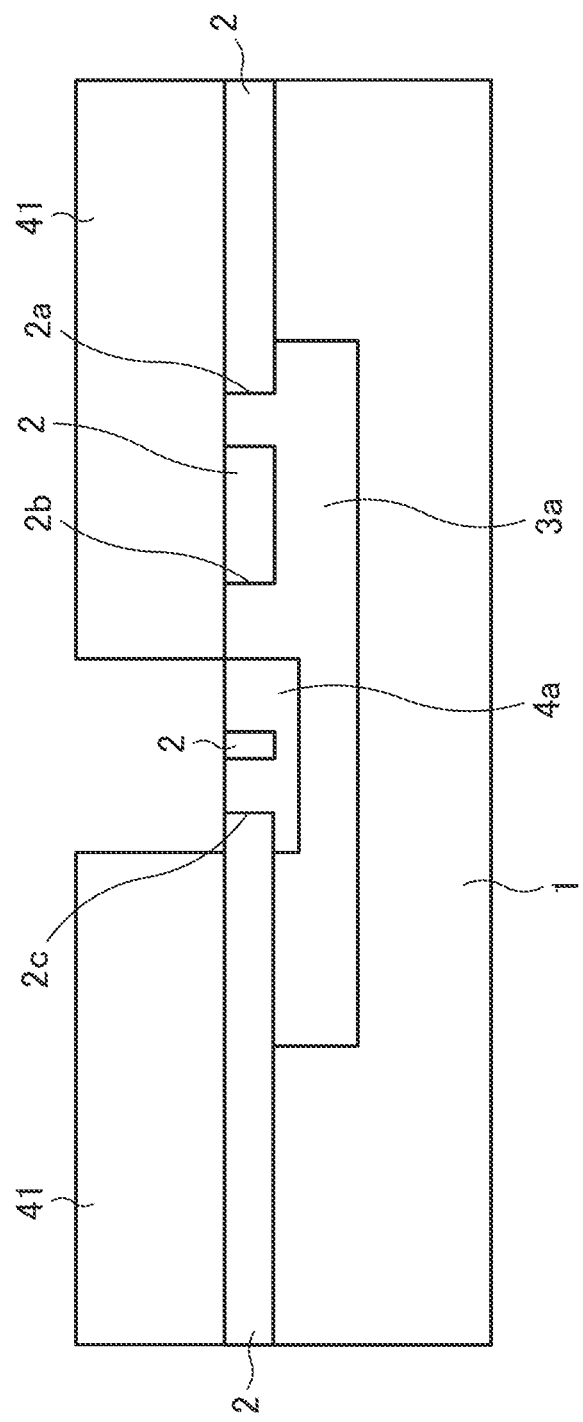
FIG. 13 illustrates an example of a second ion implantation process.

FIG. 13 illustrates an example of a second ion implantation process.

After the formation of the n-type impurity implantation region 3a, as illustrated in FIG. 13, a resist pattern 41 is formed by the photolithography so that a region including a part of the opening portion 2b and the opening portion 2c will be exposed. p-type impurity ions, such as boron ions, are then implanted with the resist pattern 41 as a mask. In this case, boron ions are implanted with a dose of $1\times10^{12}$ to $3\times10^{13}$ ions/cm$^2$ at an energy of 150 to 500 keV. This ion implantation process may be realized by performing ion implantation plural times at divided energies. In order to control threshold voltage Vth of the transistor section 11, boron ions are then implanted with a dose of $1\times10^{12}$ to $5\times10^{13}$ ions/cm$^2$ at an energy of 5 to 30 keV.

As illustrated in FIG. 13, a p-type impurity implantation region 4a is formed in this way in the n-type impurity implantation region 3a previously formed. The resist pattern 41 is then removed.

Figure 14:
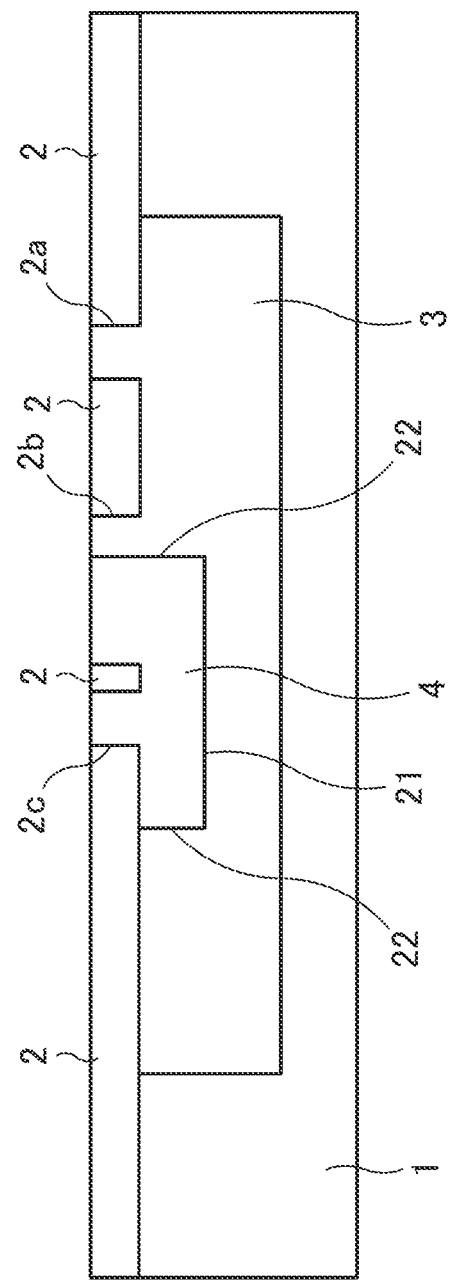
FIG. 14 illustrates an example of a heat treatment process.

FIG. 14 illustrates an example of a heat treatment process.

After the formation of the n-type impurity implantation region 3a and the p-type impurity implantation region 4a, heat treatment is performed in order to activate implanted n-type and p-type impurities and diffuse them in the p-type semiconductor substrate 1. For example, this heat treatment is performed at a temperature of 1050° C. for about 30 minutes.

As illustrated in FIG. 14, the n-type drift region 3 and a p-type body region 4 are formed by this heat treatment. The above n-type impurity implantation region 3a becomes the n-type drift region 3 as a result of this heat treatment and the above p-type impurity implantation region 4a becomes the p-type body region 4 as a result of this heat treatment.

Figure 15:
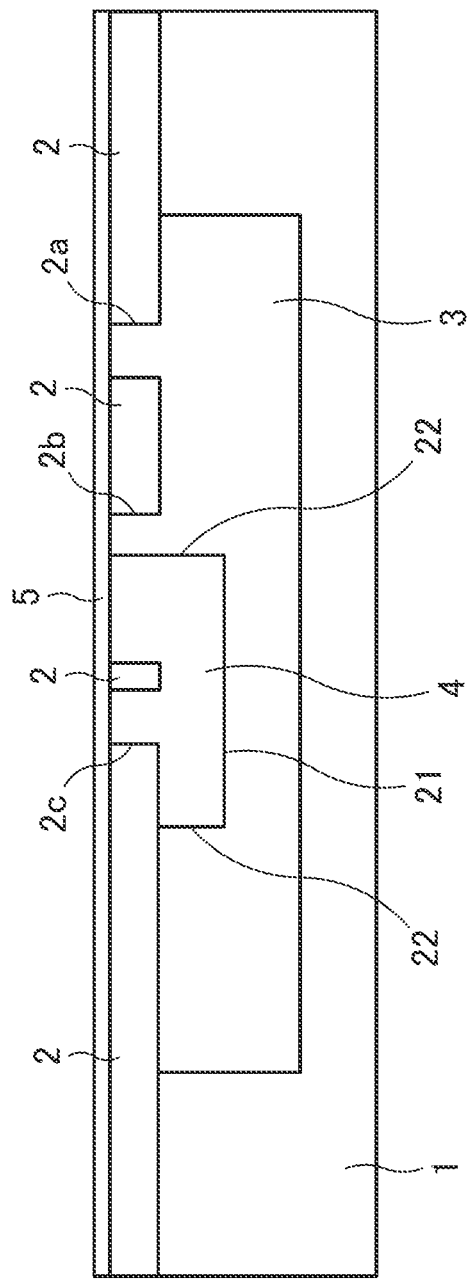
FIG. 15 illustrates an example of a gate insulating film formation process.

FIG. 15 illustrates an example of a gate insulating film formation process.

After the formation of the n-type drift region 3 and the p-type body region 4, as illustrated in FIG. 15, the gate insulating film 5 is formed. The gate insulating film 5 may be formed by, for example, an oxidation process. The thickness of the gate insulating film 5 may be set on the basis of voltage applied between the gate electrode 6 and the n-type source region 8 and the p-type body region 4. If a voltage of 5 volts, for example, is applied between the gate electrode 6 and the n-type source region 8 and the p-type body region 4, then the thickness of the gate insulating film 5 is set to 10 nm.

Figure 16:
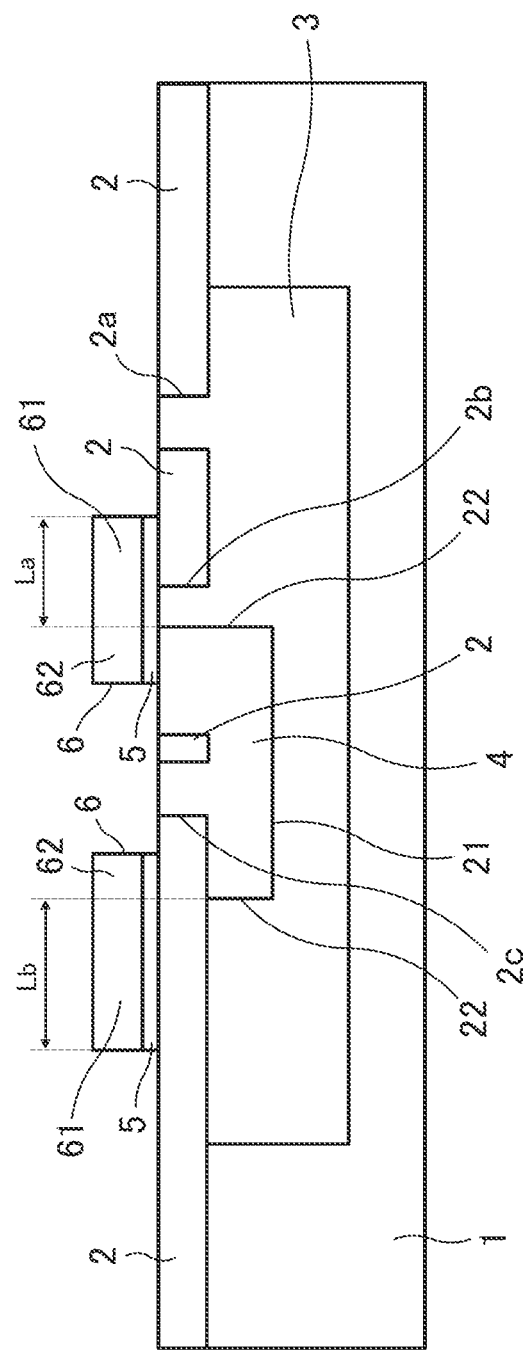
FIG. 16 illustrates an example of a gate electrode formation process.

FIG. 16 illustrates an example of a gate electrode formation process.

After the formation of the gate insulating film 5, polycrystalline silicon is formed over the gate insulating film 5 as a gate electrode material. For example, a polycrystalline silicon film with a thickness of 200 nm is formed by, for example, a CVD (Chemical Vapor Deposition) method.

After that, patterning is performed on the formed polycrystalline silicon film and the gate insulating film 5 thereunder by the photolithography and etching. This patterning is performed so that the polycrystalline silicon film and the gate insulating film 5 will have determined width which is sufficient to cover the pn junction 22 between the n-type drift region 3 and the p-type body region 4 and so that the polycrystalline silicon film and the gate insulating film 5 will be formed circularly along the pn junction 22. By doing so, as illustrated in FIG. 16, the circular gate electrode 6 and the gate insulating film 5 thereunder are formed. In this example, the patterning is performed so that (width La of outer portion 61 of gate electrode 6 horizontally outside pn junction 22)< (width Lb of outer portion 61 of gate electrode 6 horizontally outside pn junction 22). By doing so, the gate electrode 6 is formed.

Figure 17:
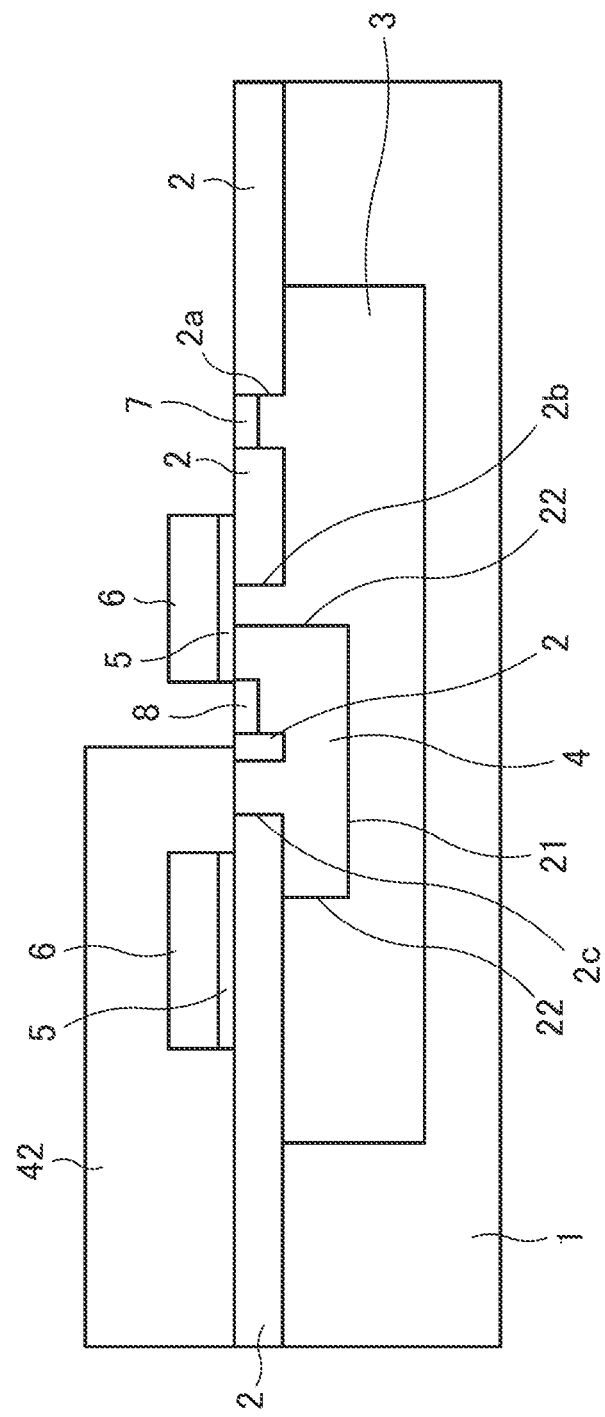
FIG. 17 illustrates an example of a third ion implantation process.

FIG. 17 illustrates an example of a third ion implantation process.

After the formation of the gate electrode 6, as illustrated in FIG. 17, a resist pattern 42 is formed by the photolithography so that a region including the opening portion 2a and a part of the opening portion 2b (which is not covered with the gate electrode 6) will be exposed. n-type impurity ions, such as phosphorus ions, are then implanted with the resist pattern 42 and the gate electrode 6 and the isolation region 2 which are not covered with the resist pattern 42 as a mask. In this case, phosphorus ions are implanted with a dose of about $1\times10^{13}$ to $1\times10^{14}$ ions/cm$^2$ at an energy of 10 to 50 keV.

As illustrated in FIG. 17, the n-type drain region 7 and the n-type source region 8 are formed in this way in the n-type drift region 3 and the p-type body region 4, respectively, which are previously formed. The resist pattern 42 is then removed.

Figure 18:
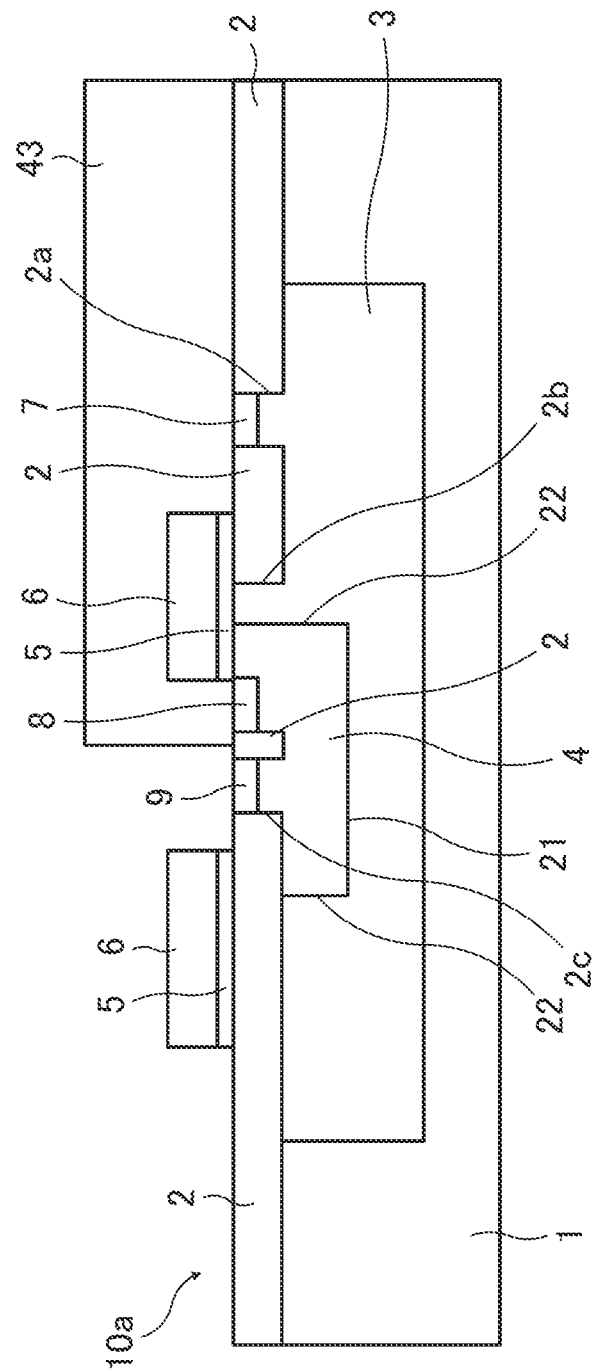
FIG. 18 illustrates an example of a fourth ion implantation process.

FIG. 18 illustrates an example of a fourth ion implantation process.

After the formation of the n-type drain region 7 and the n-type source region 8, as illustrated in FIG. 18, a resist pattern 43 is formed by the photolithography so that a region including the opening portion 2c will be exposed. P-type impurity ions, such as boron ions, are then implanted with the resist pattern 43 and the gate electrode 6 and the isolation region 2 which are not covered with the resist pattern 43 as a mask. In this case, boron ions are implanted with a dose of about $1\times10^{13}$ to $1\times10^{14}$ ions/cm$^2$ at an energy of 5 to 20 keV.

As illustrated in FIG. 18, the p-type tap region 9 is formed in this way in the p-type body region 4 previously formed. The resist pattern 43 is then removed.

The semiconductor device 10a having the above structure is formed by these processes.

Figure 19:
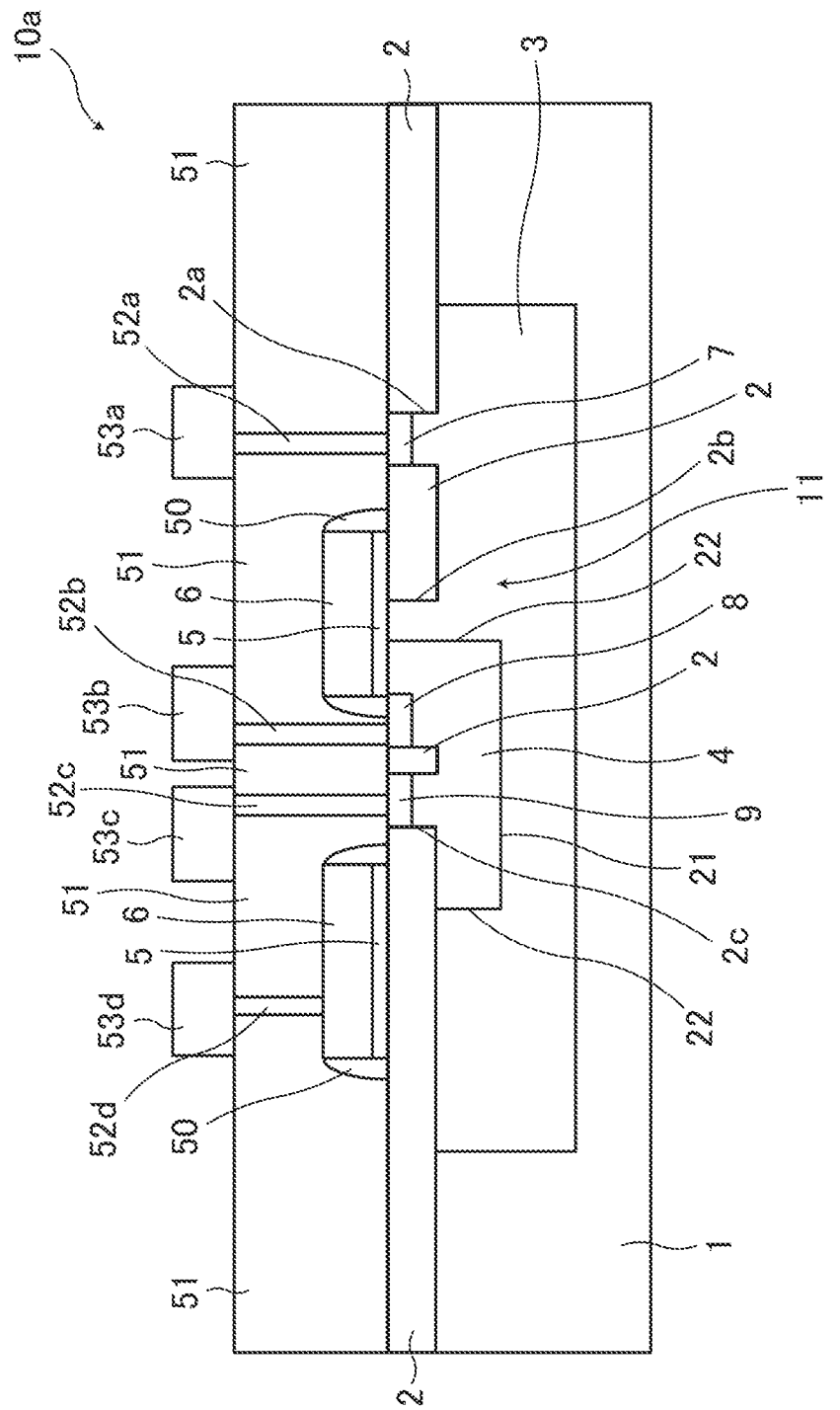
FIG. 19 illustrates an example of a state after wiring layer formation.

FIG. 19 illustrates an example of a state after wiring layer formation.

First a sidewall 50 is formed on the sides of the gate electrode 6 after the formation of the p-type tap region 9. By forming (one or more layers of) an insulating film over the p-type semiconductor substrate 1 in which the p-type tap region 9 is formed in the above way and performing an etchback, the sidewall 50 is formed.

After the formation of the sidewall 50, a high-concentration n-type layer may be formed over the n-type drain region 7 and the n-type source region 8 and a high-concentration p-type layer may be formed over the p-type tap region 9. In addition, a silicide layer may be formed over the n-type drain region 7 and the n-type source region 8 or over the high-concentration n-type layer formed over the n-type drain region 7 and the n-type source region 8. Similarly, a silicide layer may be formed over the p-type tap region 9 or over the high-concentration p-type layer formed over the p-type tap region 9. If such a silicide layer is formed, a silicide layer is also formed over the gate electrode 6.

After the processes described above, (one or more layers of) an interlayer dielectric 51 is formed over the p-type semiconductor substrate 1. After the formation of the interlayer dielectric 51, contact electrodes 52a, 52b, 52c, and 52d which pierce the interlayer dielectric and which are electrically connected to the n-type drain region 7, the n-type source region 8, the p-type tap region 9, and the gate electrode 6, respectively, are formed. By making contact holes in the interlayer dielectric 51 and embedding a conductive material in the contact holes by a sputtering method, the CVD method, or the like, the contact electrodes 52a, 52b, 52c, and 52d are formed. Tungsten (W), aluminum (Al), copper (Cu), or the like may be used as the contact electrodes 52a, 52b, 52c, and 52d. Furthermore, titanium (Ti), tantalum (Ta), or the like may be used as barrier metal for preventing such metal from diffusing.

It is desirable that the contact electrode 52d is connected not to a portion of the gate electrode 6 in the transistor section 11 but to a portion of the gate electrode 6 outside the transistor section 11 formed over the isolation region 2. The reason for this is to prevent etching in an etching process performed for making the contact holes from causing damage to the gate electrode 6 or the gate insulating film 5 in the transistor section 11 and to prevent a signal which flows through the contact electrode 52d from exerting an unintentional influence upon the operation of the transistor section 11.

After the formation of the contact electrodes 52a, 52b, 52c, and 52d, metal wirings 53a, 53b, 53c, and 53d are formed over the contact electrodes 52a, 52b, 52c, and 52d respectively. Tungsten, aluminum, copper, or the like may be used as the metal wirings 53a, 53b, 53c, and 53d. Furthermore, titanium, tantalum, or the like may be used as barrier metal for preventing such metal from diffusing.

As a result, a first wiring layer is formed. If a second wiring layer is formed, an interlayer dielectric is formed again over the structure illustrated in FIG. 19. Vias which pierce the interlayer dielectric and which reach the metal wirings 53a, 53b, 53c, and 53d are then formed and metal wirings are formed over the vias. Third and later wiring layers may be formed in the same way that is used for forming the second wiring layer.

Furthermore, the metal wirings 53a, 53b, 53c, and 53d in the first wiring layer and the vias and the metal wirings in the second and later wiring layers may be formed by a single or dual damascene process.

The semiconductor device 10a including a wiring layer is formed by these processes.

As has been described, a circular gate electrode is formed over a pn junction between an n-type drift region and a p-type body region of a semiconductor device along the pn junction. By doing so, breakdown voltage of the semiconductor device is increased. In addition, desired breakdown voltage is ensured by adjusting the width of the gate electrode (placement of the gate electrode over a p-type semiconductor substrate), impurity concentration in the n-type drift region, drift length, and the like. According to the above semiconductor device, the performance is improved.

In the above description the semiconductor device including the n-channel MOS transistor is taken as an example. However, a semiconductor device including a p-channel MOS transistor is also fabricated by inverting a conduction type. With this semiconductor device the same effects that are described above are obtained.

As illustrated in the above figures, a drift region, a body region, a drain region, a source region, a tap region, and opening portions in an isolation region which are formed in a semiconductor substrate and a gate electrode are rectangular in shape from above and their sections are rectangular in shape. However, they do not need to be rectangular in shape from above or that their sections do not need to be rectangular in shape. Their corner portions may be curved.

In addition, when the above semiconductor device is designed and fabricated, the placement of the gate electrode, impurity concentration in the n-type drift region, drift length, and the like may be adjusted. By doing so, a voltage of 20 to 100 volts, for example, may be applied to the drain region. Furthermore, an electronic apparatus including the above semiconductor device which operates under the condition that a high voltage is applied to a drain region is provided.

Figure 20:
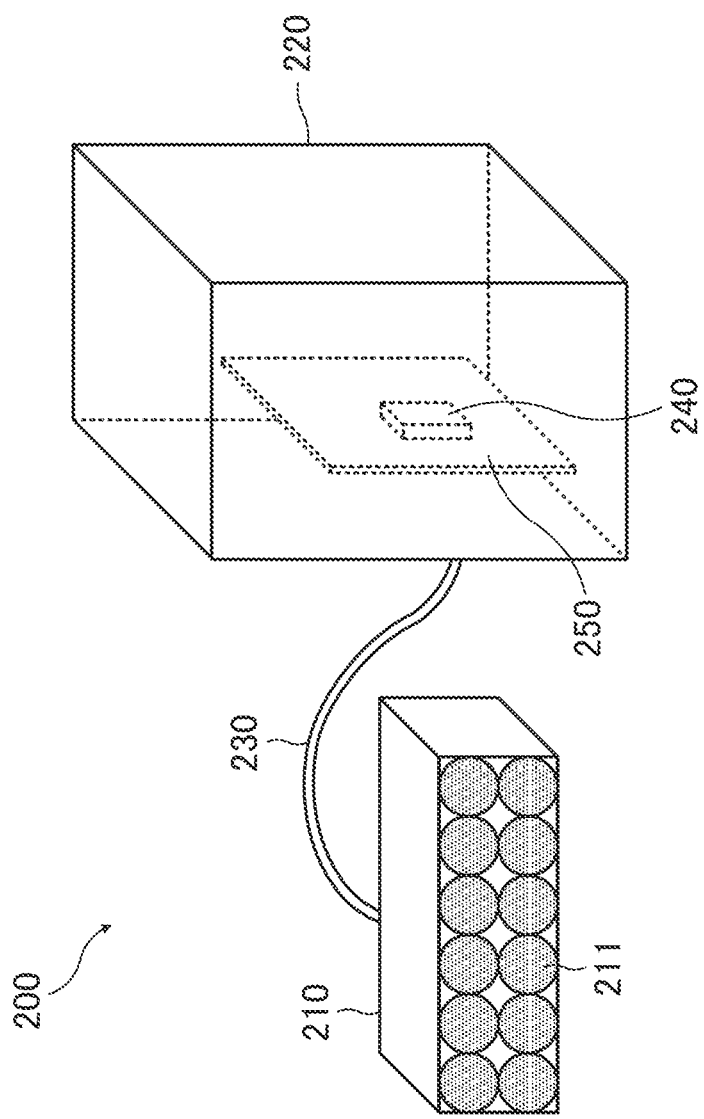
FIG. 20 illustrates an example in which the semiconductor device is applied.

FIG. 20 illustrates an example in which the semiconductor device is applied.

FIG. 20 illustrates an electronic apparatus 200 including an LED illuminator 210 with a plurality of LED (Light Emitting Diode) elements 211 and a controller 220 for controlling output to the LED illuminator 210. The LED illuminator 210 and the controller 220 are connected via a wiring 230 and a control signal is transmitted from the controller 220 to the LED illuminator 210 via the wiring 230. The controller 220 of the electronic apparatus 200 includes a circuit board 250 on which a semiconductor chip (semiconductor device) 240 including the above semiconductor devices 10 and 10a rated at, for example, 42V is mounted. It is possible to fabricate an integrated electronic apparatus 200 by putting the LED illuminator 210, the controller 220, and the wiring 230 into, for example, an enclosure.

In addition to the controller for the LED illuminator, the above semiconductor device may be applied to various electronic apparatus such as a controller for an LED backlight, a battery charger, a solarlight power generation system, and automobile-related products (such as a navigation system, an illuminator, and a body controller).

According to the disclosed semiconductor device, desired breakdown voltage is ensured and performance is improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions, and alterations could be made hereto without departing from the spirit and scope of the invention.

What is claimed is:
1. A semiconductor device comprising:
a semiconductor substrate of a first conduction type;
a first region of a second conduction type provided in the semiconductor substrate;
a second region of the first conduction type provided in the first region;
an isolation region provided over first region of a surface of the semiconductor substrate and the second region of a surface of the semiconductor substrate, and having a first opening and a second opening provided in a direction, the first opening provided at the first region, the second opening provided at a part of a junction of the first region and the second region of a surface of the semiconductor substrate, and an other part of the junction covered by the isolation region;

a gate electrode having a gate opening over the second region, provided over the isolation region and the second opening along the junction; and a drain region and a source region of the second conduction type provided in the first region of the first opening and the second region of the second opening, respectively, with a part of the gate electrode therebetween.

2. The semiconductor device according to claim 1, wherein:

the gate electrode includes an outer portion over the first region outside the junction and an inner portion over the second region inside the junction; and first width of the outer portion of the part of the gate electrode between the drain region and the source region is narrower than or equal to second width of the outer portion of an other part of the gate electrode.

3. The semiconductor device according to claim 1, wherein the drain region is provided away from the gate electrode in the first region of the first opening.

4. The semiconductor device according to claim 1 further comprising:

an insulating film provided over the semiconductor substrate so as to cover the gate electrode; and a contact electrode provided in the insulating film and connected to a part of the gate electrode other than the part of the gate electrode between the drain region and the source region.

5. The semiconductor device according to claim 1, wherein:

the isolation region has a third opening provided at the second region; and a tap region of the first conduction type is provided in the third opening.

6. A semiconductor device comprising:

a semiconductor substrate of a first conduction type;

a first region of a second conduction type provided in the semiconductor substrate;

a second region of the first conduction type provided in the first region;

a gate electrode provided over a junction of first region of a surface of the semiconductor substrate and the second region of a surface of the semiconductor substrate along the junction; and a drain region of the second conduction type provided in the first region;

a source region of the second conduction type provided in the second region and being surrounded by the gate electrode;

an isolation region provided over the first region and the second region, and having a first opening including the drain region and a second opening including the source region and the junction of the first region of the surface of the semiconductor substrate and the second region of the surface of the semiconductor substrate between the drain region and the source region; wherein the gate electrode comprises a first part and a second part; and the first part is provided between the drain region and the source region and the second part is not provided between the drain region and the source region.

7. The semiconductor device according to claim 6, wherein:

the gate electrode includes an outer portion over the first region outside the junction and an inner portion over the second region inside the junction; and first width of the outer portion of the first part of the gate electrode is narrower than or equal to second width of the outer portion of the second part of the gate electrode.

8. The semiconductor device according to claim 6, wherein the drain region is provided away from the gate electrode in the first region.

9. The semiconductor device according to claim 6, further comprising:

an insulating film provided over the semiconductor substrate so as to cover the gate electrode; and a contact electrode provided in the insulating film and connected to the second part of the gate electrode.

10. The semiconductor device according to claim 6, further comprising:

a tap region of the first conduction type in the second region inside the gate electrode.

* * * * *